US005705973A

United States Patent [19]
Yuan et al.

[11] Patent Number: 5,705,973
[45] Date of Patent: Jan. 6, 1998

[54] BIAS-FREE SYMMETRIC DUAL SPIN VALVE GIANT MAGNETORESISTANCE TRANSDUCER

[75] Inventors: Samuel W. Yuan, San Francisco; Hua-Ching Tong, San Jose; Francis H. Liu; Minshen Tan, both of Fremont, all of Calif.

[73] Assignee: Read-Rite Corporation, Milpitas, Calif.

[21] Appl. No.: 702,961

[22] Filed: Aug. 26, 1996

[51] Int. Cl.[6] .................. H01L 43/00; G01B 7/14; G01B 5/37
[52] U.S. Cl. .................. 338/32 R; 324/207.21; 360/113
[58] Field of Search .................. 338/32 R, 32 H, 338/14; 324/207.21, 249, 252; 360/113

[56] References Cited

U.S. PATENT DOCUMENTS

| | | | |
|---|---|---|---|
| 4,949,039 | 8/1990 | Grünberg | 324/252 |
| 5,018,038 | 5/1991 | Nakanishi | 360/126 |
| 5,287,238 | 2/1994 | Baumgart et al. | 360/113 |
| 5,475,304 | 12/1995 | Prinz | 324/207.21 |
| 5,508,867 | 4/1996 | Cain et al. | 360/113 |
| 5,546,253 | 8/1996 | Che | 360/113 |
| 5,583,725 | 12/1996 | Coffey et al. | 360/113 |
| 5,600,297 | 2/1997 | Ruigrok et al. | 338/32 R |

*Primary Examiner*—Adolf Berhane
*Attorney, Agent, or Firm*—Nathan N. Kallman

[57] ABSTRACT

A giant magnetoresistive dual spin valve sensor employs at least one magnetic biasing layer located adjacent to an antiferromagnetic layer in the spin valve structure which includes two pinned ferromagnetic layers. The antiferromagnetic layer simultaneously pins the biasing layer and the ferromagnetic layer nearest the antiferromagnetic layer. This structure eliminates the bias point offset present in prior dual spin valve sensors.

7 Claims, 3 Drawing Sheets

BIAS-FREE SYMMETRIC DUAL SPIN VALVE GIANT MAGNETORESISTANCE TRANSDUCER

CROSS-REFERENCE TO PATENT

U.S. Pat. No. 5,612,098, which issued Mar. 18, 1997; discloses a method wherein magnetization fields of different orientations are employed separately to induce different directions of magnetization in the first and second ferromagnetic layers. An antiferromagnetic layer which serves as a bias layer is interposed between the ferromagnetic layers to provide exchange coupling. The subject matter of this patent is incorporated herein by reference.

FIELD OF THE INVENTION

This invention relates to magnetic transducers for reproducing signals from magnetic media and in particular to improved magnetoresistive read transducers.

DESCRIPTION OF THE PRIOR ARTS

Prior art magnetic read heads using magnetoresistive (MR) sensors or heads are capable of reading data from a magnetic medium at high linear densities. An MR sensor detects magnetic field signals through resistance changes in a read element as a function of the strength and direction of magnetic flux being sensed by the read element. These prior art MR sensors operate on the basis of the anisotropic magnetoresistive (AMR) effect in which a component of the read element resistance varies as the square of the cosine of the angle between the magnetization direction and the direction of sense current flow through the element.

A more pronounced magnetoresistive effect has been described in which the change in resistance of a layered magnetic sensor is attributed to the spin-dependent transmission of the conduction electrons between the magnetic layers through a nonmagnetic layer, and the accompanying spin-dependent scattering at the layer interfaces. This magnetoresistive effect is usually referred to as "giant magnetoresistance" (GMR). Such a magnetoresistive sensor fabricated of the appropriate materials provides improved sensitivity and greater change of resistance than is observed in sensors utilizing the AMR effect. In this GMR type of sensor, the in-plane resistance between a pair of ferromagnetic layers separated by a nonmagnetic layer varies as the cosine of the angle between the magnetizations in the two layers. U.S. Pat. No. 5,206,590, Dieny et al, shows examples of such GMR structures.

U.S. Pat. No. 4,949,039, Grunberg, describes a layered magnetic structure which yields enhanced MR effects caused by antiparallel alignment of the magnetization in the magnetic layers. Grunberg also describes the use of antiferromagnetic (AFM) materials for exchange coupling to obtain the antiparallel alignment in which adjacent layers of ferromagnetic materials are separated by a thin interlayer of Cr.

FIG. 1A shows a prior art dual spin valve structure in which a free ferromagnetic (FM) layer 11 is spaced from two outer pinned FM layers 16, 17 by two conductive spacers 12, 13. Layers 16, 17 are exchanged coupled to AFM films 18, 19. By eliminating one of the spin-independent scattering outer boundaries present in a single spin valve structure and doubling the number of spin-dependent scattering interfaces, the GMR effect can be effectively increased by 50% compared to a conventional single spin valve structure. This symmetric dual spin valve has the two outer FM layers 16,17 pinned along the same transverse direction, as represented by the arrows 16a, 17a, and the magnetization of the center FM layer 11 ideally should be horizontal for proper head operation.

A potential problem associated with the prior art design of FIG. 1A is that in a patterned form the symmetric dual spin valve is intrinsically unbiased. This is due to the fact that the demagnetizing field generated by the two outer pinned FM layers 16, 17 forces the magnetization of the center free FM layer 11 to lie antiparallel to the pinned magnetization direction. The only other form of balancing fields come from the asymmetric distribution of current with respect to the free center FM layer position and the FM interlayer coupling field between the free FM layer 11 and the outer FM pinned layers 16,17. However, these fields are typically not large enough to counterbalance the demagnetizing fields. The field from the current (mostly from the shunt current flowing through one of the AFM pinning layers) cannot be too large without causing substantial shunt loss and sensor heating. The ferromagnetic interlayer coupling fields are usually on the order of 10–20 Oe (Oersteds) and cannot be increased arbitrarily without degrading the GMR sensitivity.

Micromagnetic simulations performed on a symmetric dual spin valve such as shown in FIG. 1A in both unshielded and shielded form show that for a typical sensor geometry (0.18 µm gap length, 0.5 µm stripe height, 0.5–∞µm read track-width along the stripe height direction) about a 75–100 Oe field is required to properly bias the head. FIG. 1B shows the dynamic transfer curve for a shielded symmetric dual spin valve transducer with contiguous junction hard magnet stabilization as shown in FIG. 1A.

The relative thicknesses of the different layers constituting the dual spin value can be changed in order to achieve vertical field cancellation for proper biasing. A decrease in the outer pinned FM layer thickness will reduce the GMR effect of the dual spin valve. Increasing the pinned layer thickness beyond the mean free path will increase current shunting, and will also reduce the GMR effect.

On the other hand, the free FM layer thickness can be increased to match the vertical flux from the two pinned FM layers for better biasing. However, the GMR Δ R/R ratio (where R is resistance) is found to decrease monotonically with increasing free layer thickness over the practical range. This is unlike a single spin valve, in which the GMR Δ R/R ratio has a broad maximum range with respect to a change of the free FM layer thickness. This is due to the fact that increasing the number of FM layers from 2 to 3 reduces the influence of outer boundary scattering, thereby pushing the optimal free layer thickness to a lower value and introducing greater dependence of Δ R/R on magnetic film thickness. Thus, the above two methods of matching the free and pinned FM layer thicknesses for the purpose of better biasing would compromise the intrinsic sensitivity of the dual spin-valve sensor.

Another prior art approach to fabricating a dual spin valve head without introducing the biasing problem is to utilize an anti-symmetric or asymmetric dual spin valve. In such a configuration, illustrated in FIG. 2A herein, the two outer FM layers 21, 22 are pinned in opposite directions as shown by arrows 21a, 22a so that the stray fields arising from these two layers cancel each other and the sensor is naturally self-biased. The GMR Δ R/R ratios of the two pairs of spin valves shown in FIG. 2A are assumed to be equal and opposite in sign. Since the magnetization distributions of the two pinned FM layers are ideally mirror images of each other, a perfect magnetostatic field coupling could be achieved in principle. This flux-closure is the most effective way of assuring that no stray field enters free FM layer 11.

The self-biasing effect is apparent, as shown in the dynamic transfer curve of FIG. 2B, but the design requires that the two spin valves constituting the sensor have opposite and comparable GMR effects. That is, one pair of the spin valves should have positive magnetoresistance and the other pair should have negative magnetoresistance. Such a combination is very difficult to achieve, mostly limited by the availability of proper materials and by difficulties in process matching.

SUMMARY OF THE INVENTION

The original dual spin valve head design has an intrinsic problem of bias point offset, as described above. The present invention discloses a novel GMR sensor design in which at least one additional biasing layer is introduced adjacent to the dual spin valve structure to balance the stray field generated by the pinned FM layers and to compensate for the biasing point offset. A first embodiment of the invention has two biasing layers (either soft or hard) symmetrically placed at the sides of the dual spin valve structure. An insulating AFM material is used to simultaneously pin each of the pinned FM layers and its associated biasing layer in opposite directions.

In this structure, the stray field effect is completely eliminated and the biasing level of the head is virtually independent of the sense current. Such a device achieves optimum biasing when the interlayer coupling field between the free FM layer and the pinned FM layers in the structure is minimum. Therefore, no sacrifice of head sensitivity is necessary. The film properties can be optimized separately for best sensitivity without compromising for biasing. All the advantages of a symmetric dual spin valve are maintained, yielding a 50% increase in the GMR $\Delta R/R$ ratio compared to a conventional single spin valve structure.

An alternative embodiment of the invention utilizes a single biasing layer to produce an asymmetrically biased structure.

BRIEF DESCRIPTION OF THE DRAWINGS

The invention will be described in greater detail with reference to the drawing in which.

DESCRIPTION OF THE PREFERRED EMBODIMENT

Figure 1A:
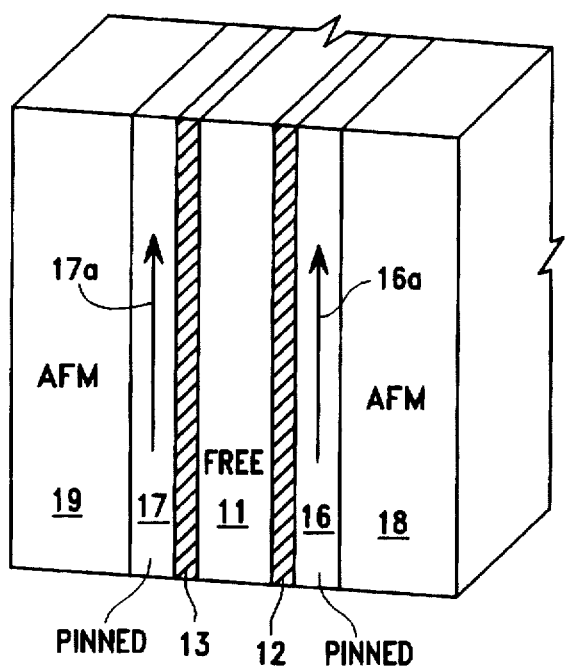
FIG. 1A is a cross-sectional isometric view of one type of a prior art dual spin valve transducer.
Figure 1B:
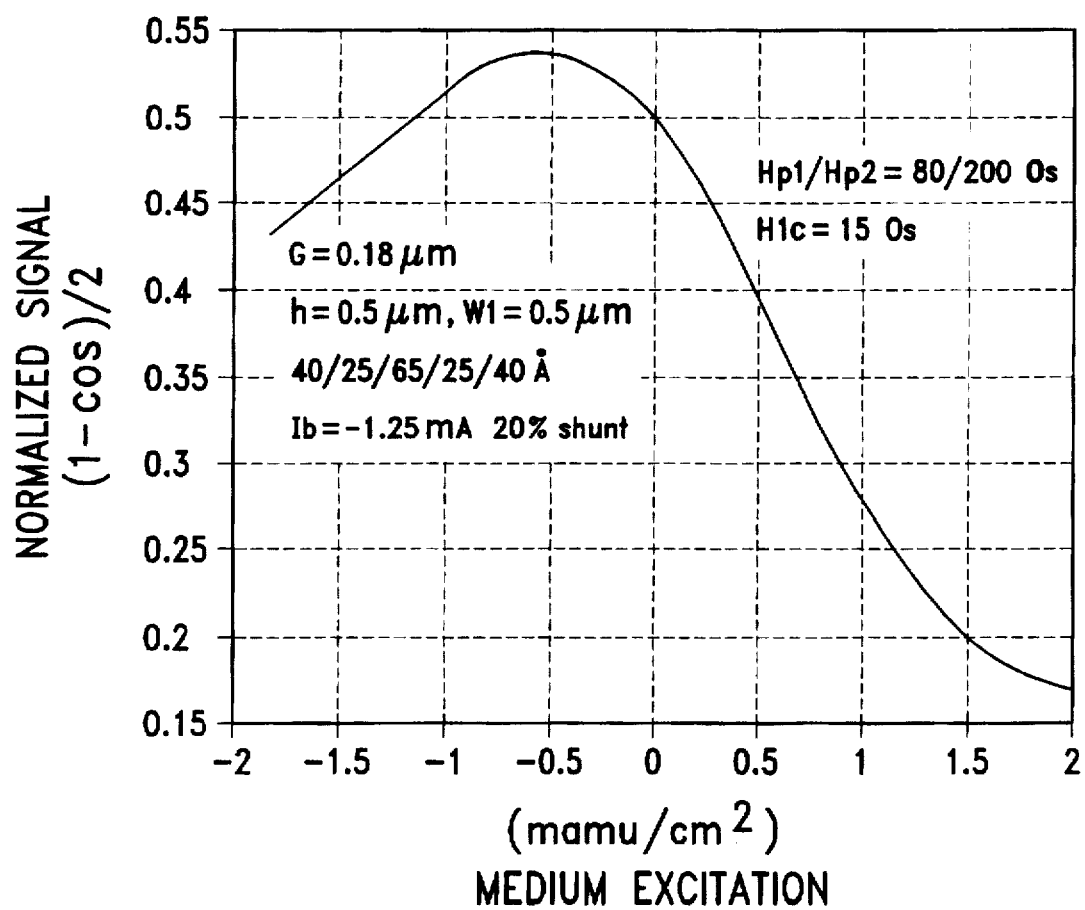
FIG. 1B shows the dynamic transfer curve for a dual spin valve transducer of the type shown in FIG. 1A.
Figure 2A:
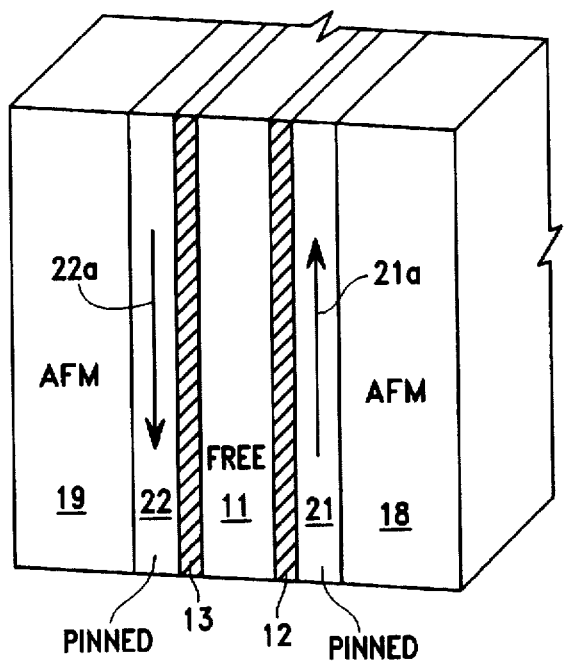
FIG. 2A is a cross-sectional isometric view of an asymmetric prior art dual spin valve transducer.
Figure 2B:
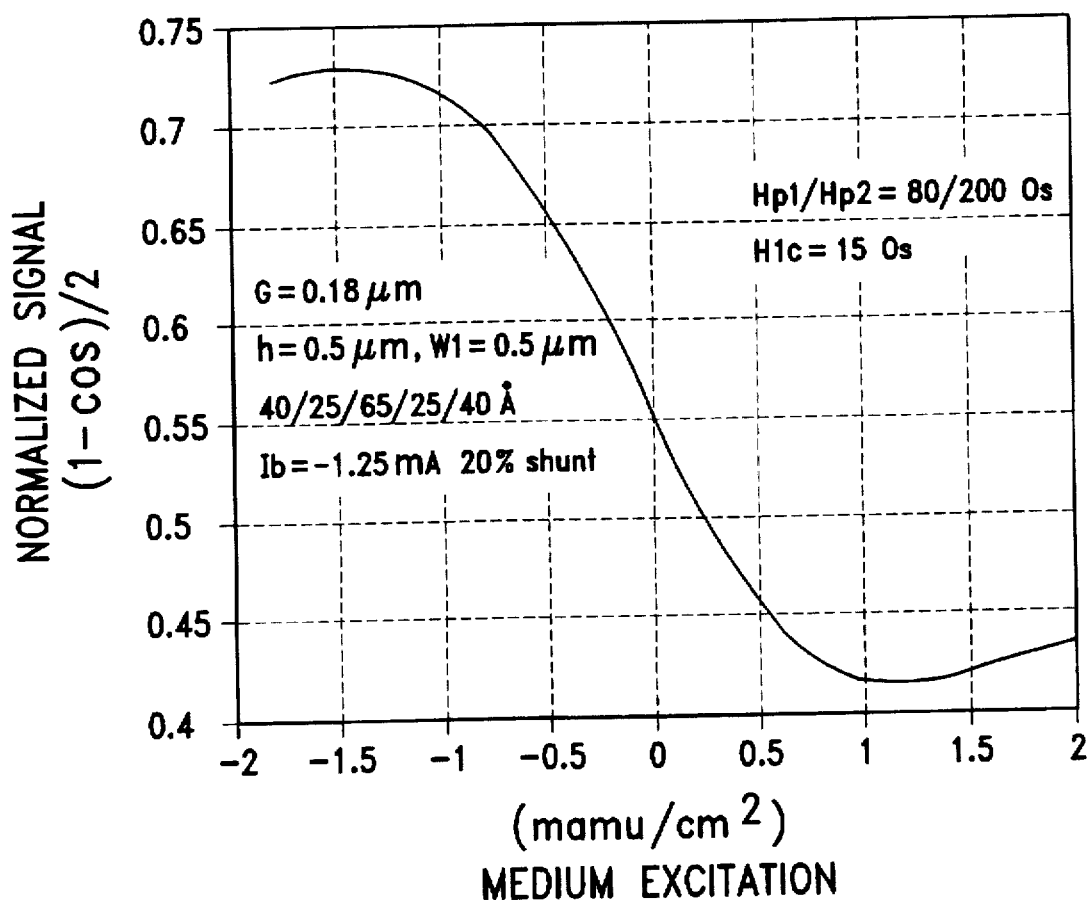
FIG. 2B is a dynamic transfer curve for an asymmetric dual spin valve transducer of the type shown in FIG. 2A.
Figure 3:
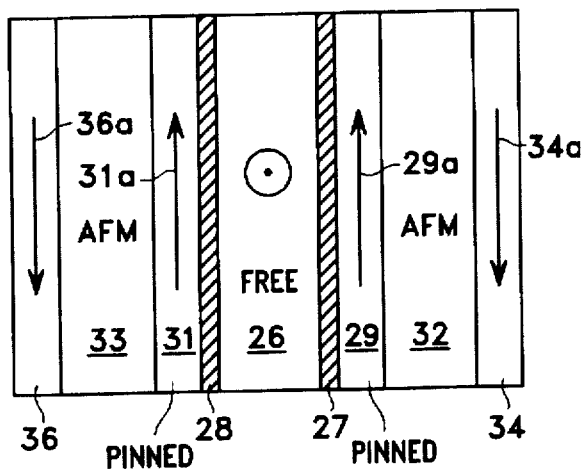
FIG. 3 is a cross-sectional isometric view of one embodiment of the present invention using symmetrical biasing.

FIG. 3 depicts one embodiment of a balanced symmetric dual spin valve sensor with symmetric placement of the two biasing layers in accordance with this invention. In FIG. 3, reference numeral 26 designates a free FM layer separated from pinned FM layers 29, 31 by spacer layers 27, 28. The directions of magnetization of pinned layers 29, 31 are the same, as shown by arrows 29a, 31a. The direction of magnetization of free layer 26 is substantially perpendicular to the fixed direction of magnetization of pinned layers 29, 31 at zero applied magnetic field. Exchange coupling AFM layers 32, 33 are located adjacent to FM layers 29, 31 respectively. Magnetic biasing layers 34, 36 are provided in accordance with this invention on each side of AFM layers 32, 33 respectively. Biasing layers 34, 36 are formed from a suitable magnetic material such as NiFe or the like. The magnetization directions in layers 34, 36 are the same, as represented by the arrows 34a, 36a.

In the design of FIG. 3, the moment-thickness of each biasing layer 34, 36 should match or be slightly larger than that of the pinned ferromagnetic layer 29, 31 adjacent to it. The latter condition can occur since the biasing layer is closer to one shield (not shown) than the pinned layer. This relation could be offset if the interlayer coupling field between the free layer and the pinned layers is ferromagnetic. By properly designing the $M_r \delta$, (where $M_r$ is the remanent moment of the magnetic film and $\delta$ is the thickness of the film), of the biasing layer, a perfect flux closure can be obtained on each side of the dual spin valve structure to produce a self-biased sensor.

Because of the symmetric placement of the spin valves and the biasing layers, the vertical current field and the stray field will fully compensate each other, and the biasing level is quite insensitive to the sense current as long as the pinning field is substantially greater than the current-induced field in the pinned layer. Advantage can be taken of this feature to optimize the device output sensitivity (voltage level) without compromising the bias and dynamic range of the sensor. The only limitation on applicable current density would be device heating, which leads to sensor burnouts and a possible loss or reduction of the exchange pinning field, and electromigration effect.

The use of the NiCoO-like insulating antiferromagnetic materials to simultaneously pin the biasing layers and the pinned layers enable the achieving of an antiparallel magnetization state and minimize current shunting loss. In an ideal situation, this balanced symmetric dual spin valve sensor will be perfectly biased when the interlayer ferromagnetic coupling between the free and the pinned layers is zero. If this coupling field is slightly positive, as is typically the case, the sensor bias point will not be affected significantly. The dynamic range of the sensor will remain virtually the same, since the spin valve is an intrinsically linear device when the bias point is not too far off.

Figure 4:
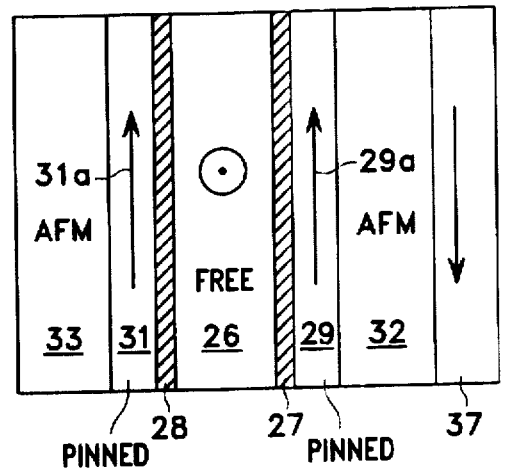
FIG. 4 is a cross-sectional isometric view of an alternate embodiment of the invention employing asymmetric biasing.

In an alternate embodiment of the invention shown in FIG. 4, to simplify the process and reduce the total number of layers, only one biasing layer 37 is placed on the antiferromagnetic film. This biasing layer can be a soft layer or a hard film, exchange coupled to its underlying antiferromagnetic layer 32. The $M_r \delta$ of this single biasing layer should be slightly larger than the sum of the $M_r \delta$ s of the two outer pinned layers 29, 31 of the dual spin valve in order to achieve flux closure and stray field cancellation among these three layers.

This bias-free dual spin valve device employs two terminals for current contacts. The current leads can be deposited on top of the contiguous junction longitudinal bias film, as taught in U.S. Pat. No. 5,018,038, Krounbi et al, at the track edges after the dual spin valve structure has been defined by photolithography or ion beam milling.

Figure 5A:
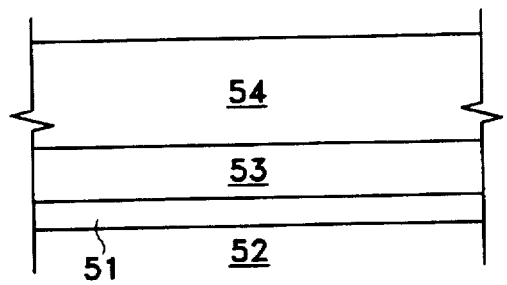
FIGS. 5A–5D illustrate steps for fabricating a transducer in accordance with this invention.

FIGS. 5A–5D show a schematic process flow of a method of fabricating devices in accordance with the present invention. First, as shown in FIG. 5A, a biasing layer 51 such as NiFe is put down on top of the first gap 52 in the structure. Then antiferromagnetic material 53 such as NiCoO of about 200–500 Å is deposited, followed by the deposition of a conventional dual spin valve structure 54 (without a top AFM exchange film at this point).

Figure 5B:
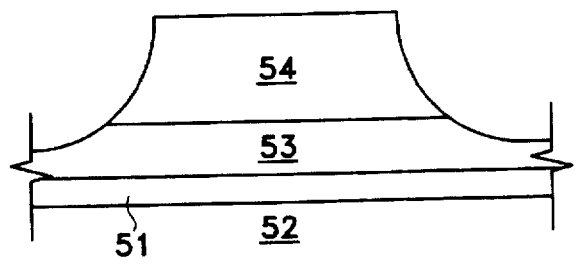

Next, as shown in FIG. 5B, ion beam milling can be employed to etch out the edge regions of the dual spin valves. The ion milling stops at the top surface of the NiCoO film 53, but the location does not have to be controlled precisely. It may be preferable to stop the ion milling inside NiCoO layer 53 such that the junction materials can be recessed with respect to the dual spin valve base plane, thereby resulting in better planarization for subsequent deposition of materials on top of the spin valve and the lead surfaces.

Figure 5C:
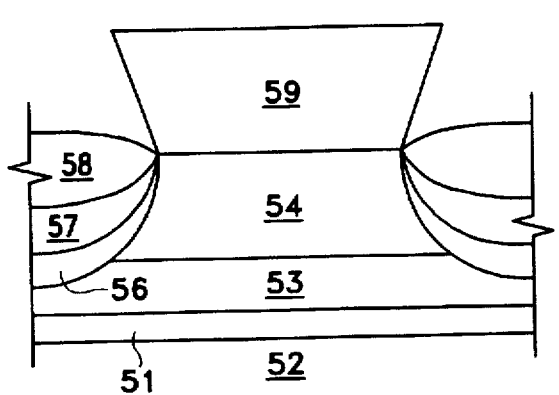
Figure 5D:
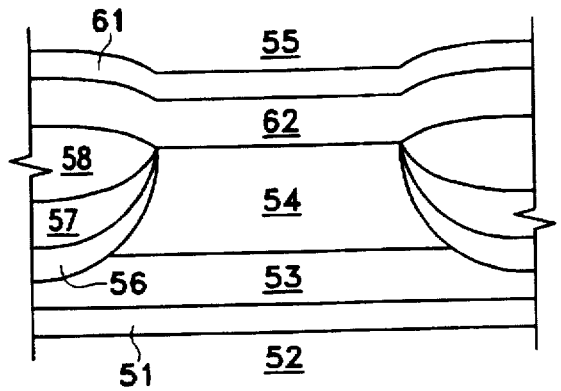

Next, as shown in FIG. 5C, the deposition of the end stabilization layers 56, 57 and lead material 58 follows the standard contiguous junction process. Stabilization layers 56, 57 can be a hard magnetic material with an enhancement underlayer, such as CoCrPt on Cr, or a soft ferromagnetic film exchange coupled to an antiferromagnetic material, such as NiFe with FeMn or NiMn. Upon removal of the photoresist mask 59 from the dual spin valve structure (FIG. 5D), a top NiCoO exchange film 62 is deposited, followed by the second biasing layer 61, as shown in the embodiment of FIG. 3, then by the dielectrics of the second gap 55. In the embodiment of FIG. 4, the single biasing layer 37 can be deposited on top of the second exchange film 62 instead of underneath the first exchange film 53.

What is claimed is:

1. A dual gap magnetoresistive sensor comprising:

a free ferromagnetic layer;

first and second spacers adjacent to opposing first and second surfaces of said ferromagnetic layer respectively;

first and second pinned ferromagnetic layers adjacent to said first and second spacers respectively, wherein the directions of magnetization of said pinned layers are the same, and the direction of magnetization of said free layer is perpendicular to that of said pinned layers at zero applied magnetic field;

first and second antiferromagnetic layers adjacent to said first and second pinned ferromagnetic layers respectively; and a magnetic biasing means disposed adjacent to at least one of said antiferromagnetic layers, the direction of magnetization of said biasing means being opposite to that of said pinned ferromagnetic layers;

so that any stray field generated by said pinned ferromagnetic layers is eliminated and the biasing level of the sensor is independent of sense current.

2. A dual gap magnetoresistive sensor as in claim 1, wherein the moment thickness of said magnetic biasing means matches that of said pinned ferromagnetic layers for producing a self-biased sensor.

3. A dual gap magnetoresistive sensor as in claim 1, wherein said ferromagnetic layers and said antiferromagnetic layers form a balanced symmetrical dual gap spin valve structure.

4. A dual gap magnetoresistive sensor as in claim 1 wherein said magnetic biasing means includes magnetic biasing layers adjacent to each of said first and said second antiferromagnetic layers.

5. A magnetoresistive sensor as in claim 4 in which said biasing layers have magnetic fields extending in the same direction.

6. A magnetoresistive sensor as in claim 5 in which the direction of said magnetic fields of said biasing layers is opposite to the fixed direction of magnetization of said first and said second layers of pinned ferromagnetic material.

7. A magnetoresistive sensor as in claim 1 wherein said magnetic biasing means comprises a single magnetic biasing layer adjacent to one of said layers of antiferromagnetic material, the direction of magnetization of said single magnetic biasing layer being opposite to the fixed direction of magnetization of said first and said second layers of said pinned ferromagnetic layers.

* * * * *